(12) United States Patent
Kim et al.

(10) Patent No.: US 9,190,137 B2
(45) Date of Patent: *Nov. 17, 2015

(54) MEMORY PERFORMING TARGET REFRESH OPERATION AND MEMORY SYSTEM INCLUDING THE SAME

(71) Applicant: SK hynix Inc., Gyeonggi-do (KR)

(72) Inventors: Bo-Yeun Kim, Gyeonggi-do (KR); Seok-Cheol Yoon, Gyeonggi-do (KR); Ji-Eun Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/298,544

(22) Filed: Jun. 6, 2014

(65) Prior Publication Data

US 2015/0162067 A1      Jun. 11, 2015

(30) Foreign Application Priority Data

Dec. 11, 2013   (KR) ........................ 10-2013-0154057

(51) Int. Cl.
*G11C 7/00* (2006.01)
*G11C 11/406* (2006.01)

(52) U.S. Cl.
CPC ........ *G11C 11/406* (2013.01); *G11C 11/40611* (2013.01)

(58) Field of Classification Search
USPC .......................................... 365/222, 236, 239
See application file for complete search history.

(56) References Cited

U.S. PATENT DOCUMENTS

| 2003/0128614 | A1* | 7/2003 | Hidaka | ......................... 365/222 |
| 2015/0085563 | A1* | 3/2015 | Yoon | .............................. 365/149 |
| 2015/0085564 | A1* | 3/2015 | Yoon et al. | ..................... 365/149 |

FOREIGN PATENT DOCUMENTS

| KR | 1020130009591 | 1/2013 |
| KR | 1020150002112 | 1/2015 |

* cited by examiner

*Primary Examiner* — Hoai V Ho
(74) *Attorney, Agent, or Firm* — IP & T Group LLP

(57) ABSTRACT

A memory may include a plurality of word lines coupled to one or more memory cells; a target address generation unit suitable for generating one or more target addresses using a stored address; and a control unit suitable for sequentially refreshing the plurality of word lines in response to a refresh command which is periodically inputted, and refreshing a word line corresponding to the target address in response to the refresh command at a random time.

16 Claims, 7 Drawing Sheets

MEMORY PERFORMING TARGET REFRESH OPERATION AND MEMORY SYSTEM INCLUDING THE SAME

CROSS-REFERENCE TO RELATED APPLICATIONS

The present application claims priority of Korean Patent Application No. 10-2013-0154057, filed on Dec. 11, 2013, which is incorporated herein by reference in its entirety.

BACKGROUND

1. Field

Exemplary embodiments of the present invention relate to a memory and a memory system including the same.

2. Description of the Related Art

A memory cell of a memory includes a transistor serving as a switch and a capacitor that store a charge (data). Depending on whether charge is stored in the capacitor of the memory cell, that is, whether a terminal voltage level of the capacitor is high or low, the data may be identified as high (logic 1) or low (logic 0) data.

Data is stored in a capacitor and no power is consumed in theory. However, since leakage current leakage in the PN junction of the MOS transistor as well as other places, the initial charge accumulated in the capacitor may decrease and data may be lost. In order to prevent data loss, data of the memory cell must be read and the charge in the capacitor must be refreshed. This is called a refresh operation FIG. 1 is a diagram illustrating part of a cell array included in a memory that will be used to explain a phenomenon called word lime disturbance. In FIG. 1, BL represents a bit line.

Referring to FIG. 1, three word lines WLK−1, WLK, and WLK+1 in the cell array are arranged in parallel. Furthermore, the K-th word line WLK with notation "HIGH_ACT" has been has been activated numerous times (i.e. the activation frequency of the K-th word line WLK is high). The (K−1)th and (K+1)th word lines are adjacent to the active K-th word line WLK. Furthermore, (K−1)th, K-th and (K+1)th memory cells CELL_K−1, CELL_K, and CELL_K+1 are coupled to the (K−1)th, K-th and (K+1)th word lines WLK−1, WLK, and WLK+1, respectively. The (K−1)th, K-th and (K+1)th memory cells CELL_K−1, CELL_K and CELL_K+1 include (K−1)th, K-th and (K+1)th cell transistors TR_K−1, TR_R, and TR_K+1 and K−1)th K-th and (K+1)th cell capacitors CAP_K−1, CAP_K and CAP_K+1 respectively.

When the K-th word line WLK is activated and precharged (deactivated), the voltages of the adjacent (K−1)th and (K+1)th word lines WLK−1 and WLK+1 fluctuate from coupling between the K-th word line WLK and the adjacent (K−1)th and (K+1)th word lines WLK−1 and WLK+1, thereby influencing charges stored in the (K−1)th and (K+1)th cell capacitors CAP_K−1 and CAP_K+1. Thus, when the K-th word line WLK is frequently activated-precharged to toggle between the active state and precharge state, data stored in the (K−1)th and (K+1)th memory cells CELL_K−1 and CELL_K+1 may be affected by the impact on charges stored in the (K−1)th and (K+1)th capacitors CAP_K−1 and CAP_K+.

Furthermore, electronic waves, which are generated while a word line toggles between the active state and the precharge state, may introduce/discharge electrons into/from a cell capacitor included in a memory cell coupled to an adjacent word line, thereby affecting the data of the memory cell.

SUMMARY

Various embodiments are directed to a memory and a memory system that prevents word line disturbance.

In an embodiment, a memory may include a plurality of word lines coupled to one or more memory cells, a target address generation unit suitable for generating one or more target addresses using a stored address, and a control unit suitable for sequentially refreshing the plurality of word lines in response to a refresh command which is periodically inputted, and refreshing a word line corresponding to the target address in response to the refresh command at a random time.

The memory may further include an address detection unit suitable for detecting a highly active word line, designated by having an activation count that is greater than or equal to a preset number or having an activation frequency that is greater than or equal to a preset frequency, during a preset period.

The memory may further include an address counting unit suitable for generating a counting address, a value of which is changed whenever a word line is refreshed.

The control unit may include a refresh control unit suitable for enabling a first refresh signal in response to the refresh command, and enabling a second refresh signal in response to the refresh command at a random time. And a control unit suitable for refreshing a word line corresponding to the counting address in response to the first refresh signal, and refreshing a target word line corresponding to the target address in response to the second refresh signal.

The refresh control unit may include a first refresh signal generator suitable for enabling the first refresh signal in response to the refresh command, and a second refresh signal generator suitable for enabling the second refresh signal in response to the refresh command at a random time.

The second refresh signal generator may include a first counter suitable for counting the refresh command and generating first counting information, a second counter suitable for counting the refresh command and generating second counting information, and a signal generator suitable for enabling the second refresh signal in response to the refresh command when the first counting information has a preset value, and controlling the first counter to initialize the first counting information to an initial value when the second counting information has a preset value.

The second refresh signal generator may include a counter suitable for counting the refresh command and generating counting information, a periodic signal generator suitable for generating a periodic signal which toggles at a preset period, and a signal generator suitable for enabling the second refresh signal in response to the refresh command when the counting information has a preset value, and controlling the counter to initialize the counting information to an initial value in response to the periodic signal.

The second refresh signal generator may include a random number generator suitable for generating a random number in response to the refresh command, and a signal generator suitable for enabling the second refresh signal when the random number has a preset value.

In an embodiment, a memory system may include a memory and a memory controller suitable for periodically inputting a refresh command to the memory. The memory may include a plurality of word lines coupled to one or more memory cells, a target address generation unit suitable for generating one or more target addresses using a stored address, and a control unit suitable for sequentially refreshing the plurality of word lines in response to the refresh command, which is periodically inputted, and refreshing a word line corresponding to the target address in response to the refresh command at a random time.

In an embodiment, a memory system may include a plurality of word lines and a refreshing unit suitable for refreshing one or more of the plurality of word lines in response to one or more of every input of a periodical refresh command and every N-th input count of the periodical refresh command, wherein the refreshing unit initializes the input count after every M-th input of the periodical refresh command.

DETAILED DESCRIPTION

Figure 1:
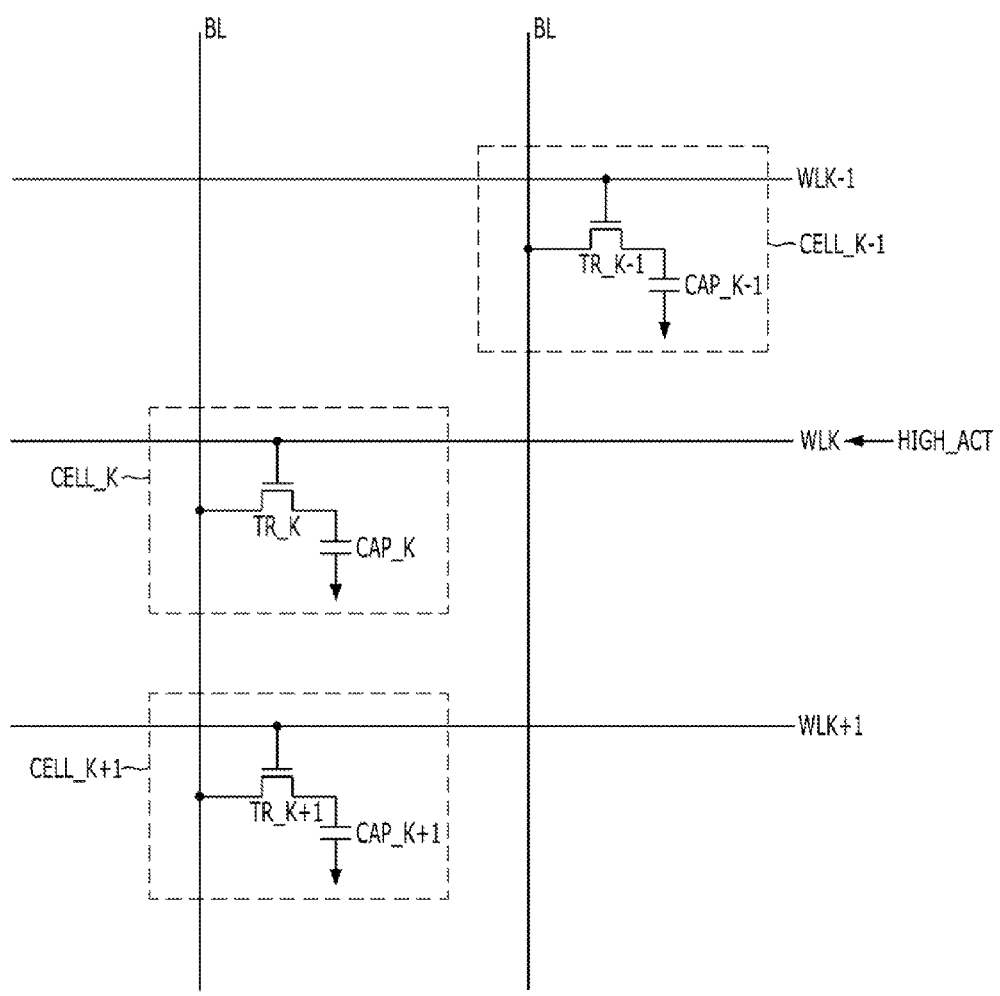
FIG. 1 is a diagram illustrating part of a cell array in a memory.

Various embodiments will be described below in detail with reference to the accompanying drawings. The present invention may be embodied in different forms and should not be construed as limited to the embodiments set forth herein. These embodiments are provided so that this disclosure will be thorough, complete, and will fully convey the scope of the present invention to those skilled in the art. Throughout the disclosure, like reference numerals refer to like parts throughout the various figures and embodiments.

In this specification, a highly active word line may indicate a word line whose number of activations is greater than or equal to a preset number whose activation frequency is greater than or equal to a preset frequency, during a preset period. For example, a word line activated 10^5 times or more during a preset period may be designated as a highly active word line. Also, a word line activated two or more times per five active operations during a preset period may be designated as a highly active word line. Hereafter, a normal refresh operation may indicate an operation in which a memory sequentially refreshes a number of word lines, and a target refresh operation may indicate an operation in which the memory refreshes one or more word lines adjacent to a highly active word line.

Figure 2:
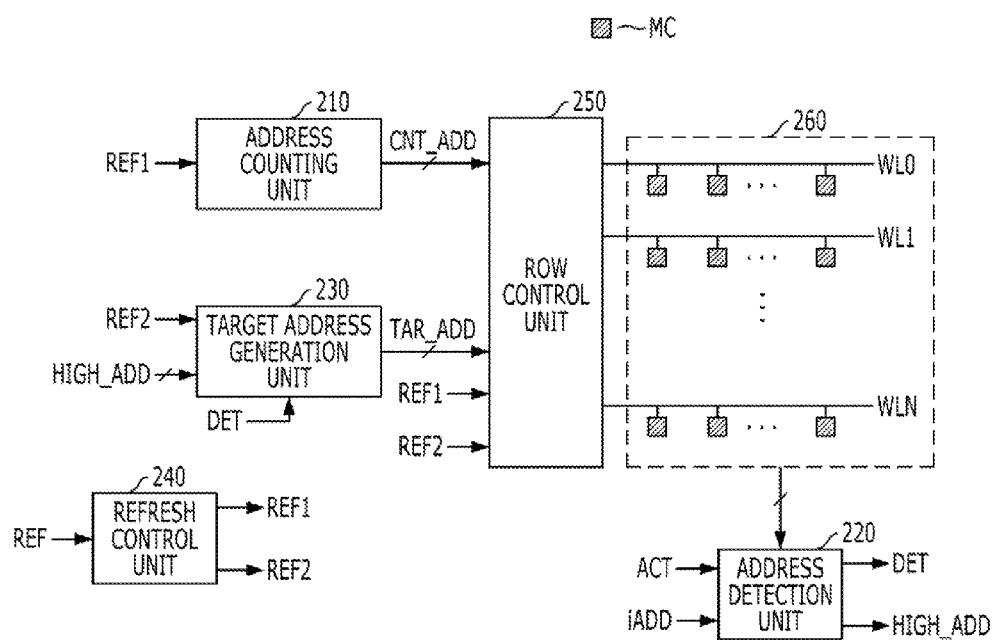
FIG. 2 is a diagram illustrating part of a memory.

FIG. 2 is a diagram illustrating part of a memory used to explain a target refresh operation.

As illustrated in FIG. 2, the memory may include an address counting unit 210, an address detection unit 220, a target address generation unit 230, a refresh control unit 240, a row control unit 250, and a cell array 260. The cell array 260 may include a plurality of word lines WL0 to WLM coupled to one or more memory cells MC.

The refresh control unit 240 may enable a first refresh signal REF1 one or more times when a refresh command REF is inputted, and enable a second refresh REF2 whenever the refresh command REF is inputted a preset number of times. For example, the refresh control unit 240 may enable the first refresh signal REF1 when the refresh command REF is inputted, count how many times the refresh command REF is inputted, and enable the second refresh command REF whenever the refresh command REF is inputted four times.

The address counting unit 210 may generate a counting address CNT_ADD and change the value of the counting address CNT_ADD whenever the first refresh signal REF1 is enabled. The address counting unit 210 may increase the value of the counting address CNT_ADD by one whenever the first refresh signal REF1 is enabled. When the address counting unit 210 increases the value of the counting address CNT_ADD by one, it may indicate that the address counting unit 210 changes the counting address CNT_ADD such that a (K+1)th word line WLK+1 is selected when a K-th word line WLK was previously selected.

The address detection unit 220 may detect a highly active word line by referring to information on activated word lines during a preset period, enable a detection signal DEL and output an address HIGH_ADD of the highly active word line (hereafter, referred to as a highly active address HIGH_ADD). The address detection unit 220 may receive an active command ACT and an input address iADD so as to detect a highly active word line or it may directly receive activity information of each word line from the cell array 260 to detect a highly active word line.

The target address generation unit 230 may store the highly active address HIGH_ADD when the detection signal DET is enabled and generate a target address TAR_ADD corresponding to a word line adjacent to the highly active word line using the stored address. The target address generation unit 230 may output the target address TAR_ADD when the second refresh signal REF2 is enabled. The target address TAR_ADD may have a value obtained by adding or subtracting one to or from the address of the highly active word line.

The row control unit 250 may refresh a word line corresponding to the counting address CNT_ADD when the first refresh signal REF1 is enabled and refresh a word line corresponding to the target address TAR_ADD when the second refresh signal REF2 is enabled.

The memory may refresh a word line corresponding to the counting address CNT_ADD in response to the first refresh signal REF1 when the refresh command REF is inputted. The value of the counting address CNT_ADD changes in sequential order and thus a plurality of word lines WL0 to WLM included in the memory may be sequentially refreshed (normal refresh). The memory may refresh a word line corresponding to the target address TAR_ADD in response to the second refresh signal REF2 when the refresh command REF is inputted a preset number of times (target refresh). The word line corresponding to the target address TAR_ADD may include one or more word lines adjacent to the highly active word line.

Figure 3:
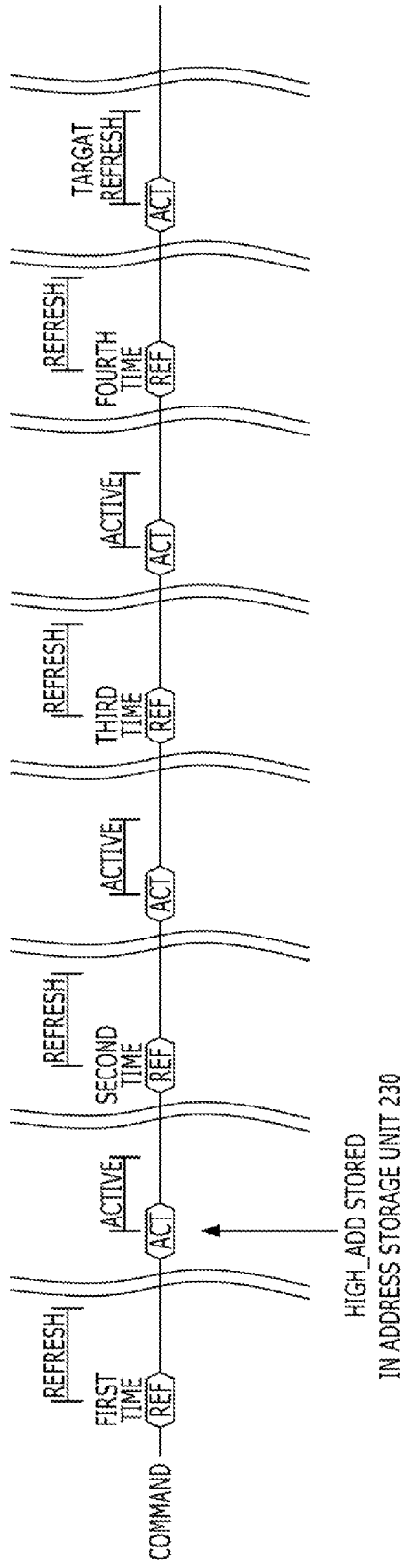
FIG. 3 is a timing diagram illustrating a refresh operation of the memory of FIG. 2.

FIG. 3 is a timing diagram illustrating a refresh operation of memory of FIG. 2.

As illustrated in FIG. 3, the refresh command REF may be periodically inputted to the memory and the memory performs a refresh operation during a refresh period REFRESH in response to the refresh command REF. The memory may perform active operations ACTIVE in response to dozens or hundreds of active commands ACT between refresh periods REFRESH.

For example, suppose that the memory performs a target refresh operation whenever the refresh command REF is inputted four times.

When a highly active word line occurs (HIGH_ACT), a highly active address HIGH_ADD may be stored in the target address generation unit 230, and the memory may perform a target refresh operation (TARGET REFRESH) using the stored address in response to the refresh command REF be inputted for a fourth time. However, since many active operations are performed between the respective refresh periods REFRESH, the memory may perform several hundred active operations before the target refresh operation is performed even after the highly active word line is detected and the highly active address HIGH_ADD is stored. Thus, even a substantial amount of time after the highly active word line is detected, the memory may still perform an active operation on it. The memory may perform a target refresh operation after a memory cell coupled to a word line adjacent to the highly active word line is damaged by word line disturbance, which may be too late to secure the data of the memory cell. In this case, word line disturbance may not be properly prevented due when a number of highly active word lines occur between target refresh operations.

Figure 4:
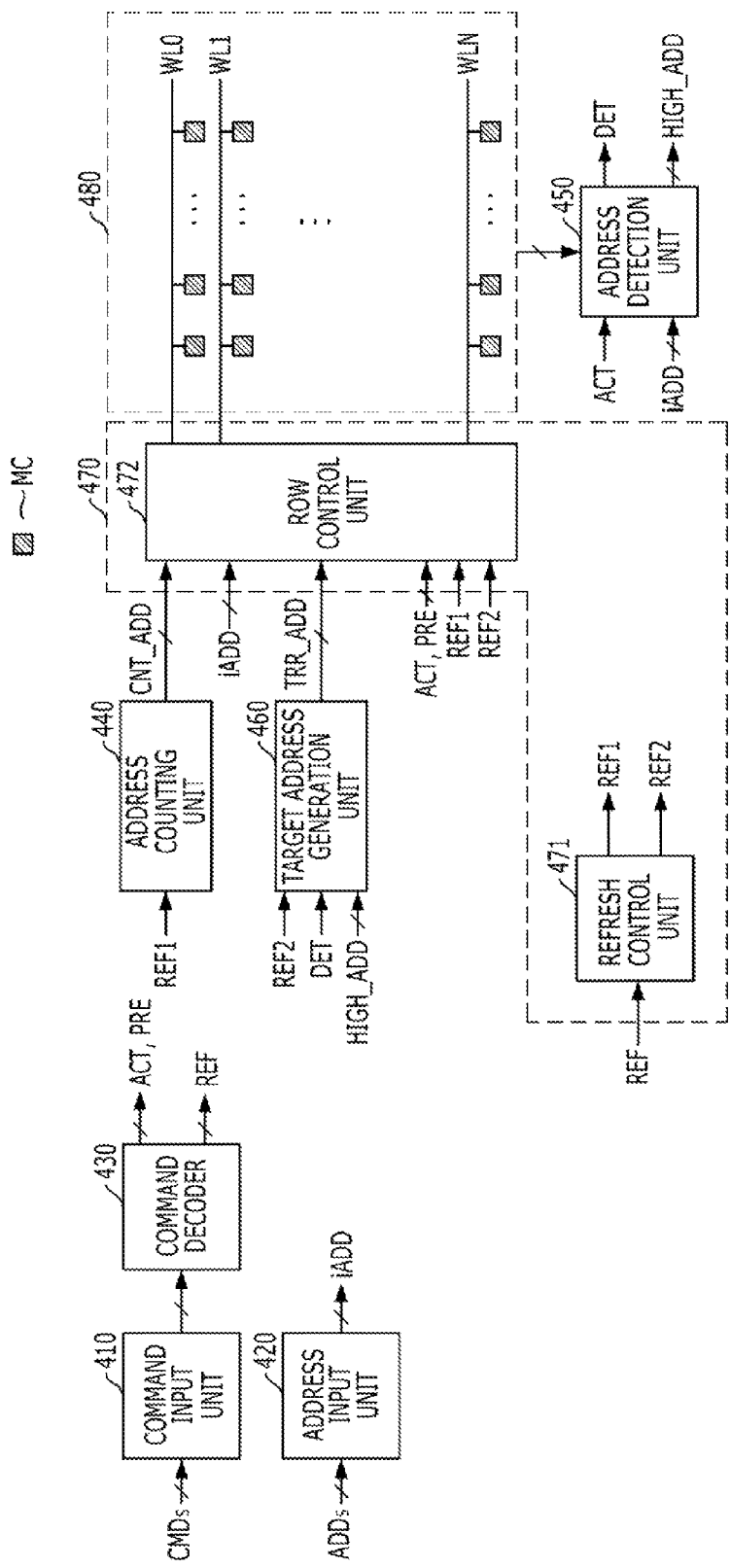
FIG. 4 is a block diagram illustrating a memory in accordance with an embodiment of the present invention.

FIG. 4 is a block diagram illustrating a memory in accordance with an embodiment of the present invention.

As illustrated in FIG. 4 the memory may include a command input unit 410, an address input unit 420, a command decoder 430, an address counting unit 440, an address detection unit 450, a target address generation unit 460, a control unit 470 and a cell array 480. The cell array 480 may include a plurality of word lines WL0 to WLM coupled to one or more memory cells MC.

The command input unit 410 may receive commands CMDs and the address input unit 420 may receive addresses ADDs. Each of the commands CMDs and the addresses ADDs may include multi-bit signals.

The command decoder 430 may decode the command signals CMDs inputted through the command input unit 410, and generate an active command ACT, a refresh command REF, and a precharge command PRE. The command decoder 430 may enable one of the active command ACT, the refresh command REF, and the precharge command PRE through a combination of the input command signals CMDs. In addition, the command decoder 430 may also generate read and write commands by decoding the input command signals CMDs.

The address counting unit 440 may generate a counting address CNT_ADD where the value is changed whenever word lines WL0 to WLM are refreshed. The address counting unit 440 may increase the value of the counting address CNT_ADD by one whenever the first refresh signal REF1 is enabled. The counting address CNT_ADD may be used for selecting a word line on which a normal refresh operation is to be performed. When the value of the counting address CNT_ADD is increased by one, it may indicate that the counting address CNT_ADD is changed to select a (K+1)th word line WLK+1 where a K-th word line WLK was previously selected.

When the address detection unit 450 detects a highly active word line by referring to information on activated word lines during a preset period, the address detection unit 450 may enable a detection signal DET, and output the highly active address HIGH_ADD of the highly active word line.

The address detection unit 450 may receive an active command ACT and an input address iADD, count how many times each word line is activated during a preset period, compare the number of activations of each word line with the preset number, and detect a highly active word line, which is activated a preset number of times or more during the preset period. Furthermore, the address detection unit 450 may store the activation history of each word line during the preset period, compare the activation frequency of each word line with the preset frequency, and detect the highly active word line, which is activated at a preset frequency or more during the preset period. The activation history may include information indicating which word lines have been activated during the preset period. As another example, the address detection unit 450 may directly receive the number of activations of each word line or the activation history of each word line from the cell array 480 and detect a highly active word line. The address detection unit 450 may detect a highly active word line through one or more of the two above-described methods.

The preset number and the preset frequency may be set in consideration of how much the memory cell MC can endure word line disturbance. For example, the address detection unit 450 may set the preset number to $10^5$ and detect a word line which is activated $10^5$ times or more during the preset period as a highly active word line. Alternatively the address detection unit 450 may set the preset frequency to two or more times per five active operations and detect a word line which is activated two or more times per five active operations during a preset period. The preset period may be offset to a specific amount of time, or as a specific number of active commands ACT or refresh commands REF.

The target address generation unit 460 may store the highly active address HIGH_ADD of the highly active word line which is outputted through the address detection unit 450 when the detection signal DET is enabled and generate and output the target address TAR_ADD when the second refresh signal REF1 is enabled. The target address TAR_ADD may include addresses of one or more word lines adjacent to the highly active word line. For example, the target address generation unit 460 may generate and output the target address TAR_ADD (a value of the target address TAR_ADD is obtained by adding or subtracting '1' to or from the value of the stored highly active address HIGH_ADD) which includes one or more of addresses immediately before and after the highly active address HIGH_ADD in sequence when the second refresh signal REF2 is enabled. When a K-th word line WLK is the highly active word line, the target address TAR_ADD may include addresses corresponding to the (K−1)th and (K+1)th word lines WLK−1 and WLK+1, which are adjacent to the highly active word line WLK.

The control unit 470 may receive the commands ACT, PRE, and REF and the input address iADD, and access the cell array 480. The control unit 470 may activate a word line corresponding to the input address iADD in response to the active command ACT, and precharge the activated word line in response to the precharge command PRE. The control unit 470 may sequentially refresh the plurality of word lines WL0 to WLM in response to the refresh command REF, which is periodically inputted while irregularly refreshing a word line corresponding to the target address TAR_ADD in response to the refresh command REF.

More specifically, the control unit 470 may perform a target refresh operation at every N-th input count of the refresh command REF. In this case, the control unit 470 may change sequential order for performing the target refresh operation by intermittently resetting or initializing the input count of the refresh command REF during periodic inputs of the refresh command REF. At this time, the control unit 470 may reset or initialize the input count of the refresh command REF after every M-th input of the refresh command REF in order to change the activation point of the target refresh operation. As another example, the control unit 470 may reset or initialize the input count of the refresh command REF based on a predetermined period in order to change the activation point of the target refresh operation.

For example, the control unit 470 may perform one target refresh operation whenever the refresh command REF is inputted four times. The control unit 470 may then change the sequential order of the target refresh operation. The operation of the memory in this case will be described below with reference to FIG. 6. Furthermore, the control unit 470 may periodically change the sequential order of the target refresh operation while four refresh commands REF are inputted. The operation of the memory in this case will be described below with reference to FIG. 7.

For such an operation, the control unit 470 may include a refresh control unit 471 and a row control unit 472. The refresh control unit 471 may enable the first refresh signal REF1 in response to the refresh command REF and irregularly enable the second refresh signal REF2 in response to the refresh command REF. For example, the refresh control unit 471 may enable the first refresh signal REF1 at every input of the refresh command REF while enabling the second refresh signal REF2 at every N-th input count of the refresh command REF, and change the sequential order for performing the target refresh operation by intermittently resetting or initializing the input count of the refresh command REF. The detailed operation of the refresh control unit 471 will be described below with reference to FIGS. 5 to 8.

The row control unit 472 may activate a word line corresponding to the input address iADD when the active command ACT is enabled and precharge the activated word line when the precharge command PRE is enabled. The row control unit 472 may refresh a word line corresponding to the counting address CNT_ADD when the first refresh signal REF1 is enabled and refresh a word line corresponding to the target address TAR_ADD when the second refresh signal REF2 is enabled. The entire operation of the memory will be described below in detail with reference to FIGS. 5 to 8.

The memory may perform the normal refresh operation one or more times in response to one refresh command REF and perform the target refresh operation while the refresh command REF is inputted N times. The memory may then sequentially perform the normal refresh operation and the target refresh operation in response to one refresh command REF or perform one normal refresh operation and the target refresh operation in response to one refresh command REF. The first refresh signal REF1 may be enabled for the normal refresh operation and the second refresh signal REF2 may be enabled for the target, refresh operation. The refresh control unit 471 may enable the first refresh signal REF1 one or more times in response to the refresh command REF and enable the second refresh signal REF2 while the refresh command REF is inputted N times. The refresh control unit 471 may sequentially enable the first refresh signal REF1 and the second refresh signal REF2 or enable one of the first and second refresh signals REF1 and RFE2 one or more times in response to one refresh command REF.

The memory may perform the target refresh operation on a word line adjacent to the highly active word line in order to prevent word line disturbance. In particular, the memory may perform the target refresh operation at a random time, thereby increasing the possibility that the target refresh operation will be performed on the adjacent word line immediately after the highly active word line is detected. Thus, it is possible to reduce word line disturbance.

Figure 5:
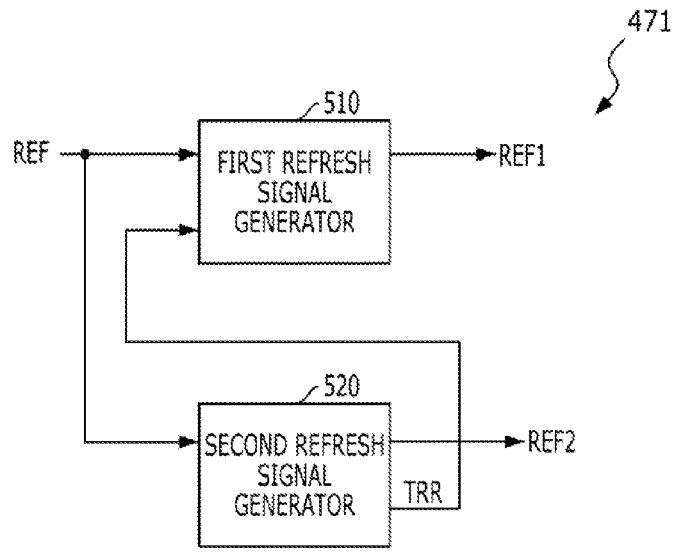
FIG. 5 is a block diagram illustrating a refresh control unit shown in FIG. 4.

FIG. 5 is a block diagram illustrating the refresh control unit 471 shown in FIG. 4.

As illustrated in FIG. 5, the refresh control unit 471 may include a first refresh signal generator 510 and a second refresh signal generator 520. The following descriptions will be focused on a case in which the memory performs one normal refresh operation per one refresh command REF, performs one target refresh operation at every N-th input count of the refresh command REF, and does not perform the normal refresh operation when the target refresh operation is performed. In this case, the refresh control unit 471 may enable one of the first and second refresh signals REF1 and REF2 in response to one refresh command REF.

The first refresh signal generator 510 may enable the first refresh signal REF1 in response to the refresh command REF and disable the first refresh signal REF1 when a target refresh signal TRR is enabled. The second refresh signal generator 520 may irregularly enable the second refresh signal REF2 and the target refresh signal TRR in response to the refresh command REF. The target refresh signal TRR may stay enabled during the target refresh operation. For example, when X numbers of word lines are refreshed during the target refresh operation, the target refresh signal TRR may stay enabled while the memory refreshes the X word lines.

That is, the refresh control unit 471 may continuously change the sequential order of the target refresh operation, which is performed at every N-th input count of the refresh command REF by intermittently resetting or initializing the input count of the refresh command REF during periodic inputs of the refresh command REF such that the target refresh operation is performed at a random time.

Figure 6:
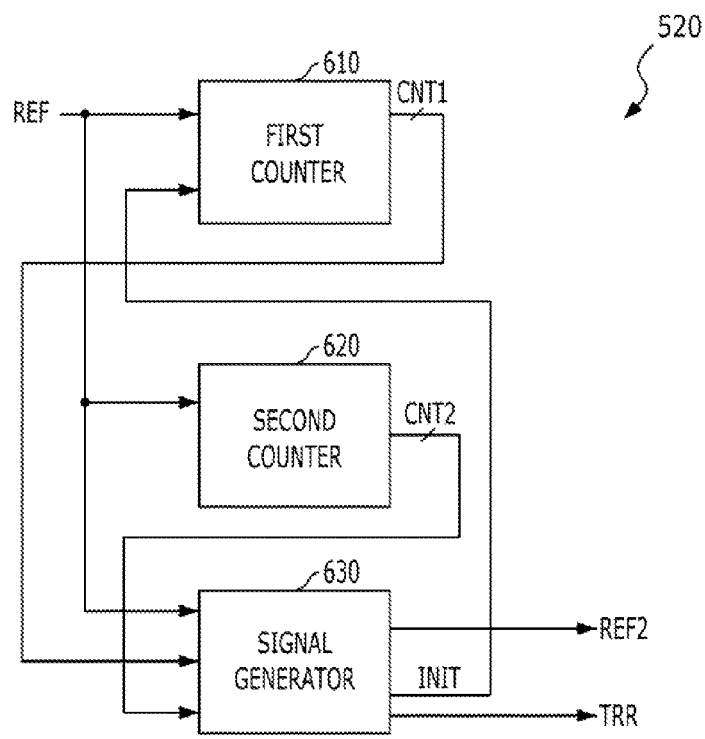
FIG. 6 is a block diagram illustrating an example of a second refresh signal generator shown in FIG. 5.

FIG. 6 is a block diagram illustrating an example of the second refresh signal generator 520 shown in FIG. 5.

As illustrated in FIG. 6, the second refresh signal generator 520 may include a first counter 610, a second counter 620, and a signal generator 630. The first counter 610 may count the refresh command REF and generate first counting information CNT1 which has a cyclic period N. The second counter 620 may count the refresh command REF and generate second counting information CNT2 which has a cyclic period L. The signal generator 630 may enable the second refresh signal REF2 and the target refresh signal TRR in response to the refresh command REF when the first counting information CNT1 has a preset value. The signal' generator 630 may enable an initialization signal INIT such that the first counter 610 initializes the first counting information CNT1 when the second counting information CNT2 has a preset value. The first counter 610 may initialize the first counting information CNT1 to an initial value at every N-th input of the refresh command REF or when the initialization signal INIT is enabled.

The following descriptions will be focused on a case in which the first counting information CNT1 has a cyclic period 4 (N=4) the second counting information CNT2 has a cyclic period 64 (L=64), and the first counting information CNT1 is reset or initialized after every 15th (M=15) input of the refresh command REF. The first counter 610 may count the first counting information CNT1 in order of 00 (initial value), 01, 10, and 11 (maximum value), which are binary representation of decimal 1 to 4, and the signal generator 630 may enable the second refresh signal REF2 in response to the refresh command REF when the first counting information CNT1 is binary "11" representing decimal 4. Also, the signal generator 630 may enable the initialization signal INIT when the refresh command REF is inputted a multiple of 15 times (for example, 15 times, 30 times, 45 times, or 60 times). The first counter 610 may initialize the first counting information CNT1 in response to the enabled initialization signal INIT regardless of the current value of the first counting information CNT1. That is, the control unit 470 may perform the target refresh operation at every 4th input count (CNT1) of the refresh command REF and may intermittently reset or initialize the input count (CNT1) of the refresh command REF after every 15th (M=15) input of the refresh command REF in order to change activation point of the target refresh operation. Table 1 shows the operation of a memory depending on the input of the refresh command REF in the above-described example,

TABLE 1

| CNT2 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| CNT1 | 00 | 01 | 10 | 11 | 00 | 01 | 10 | 11 | 00 | 01 | 10 | 11 | 00 | 01 | 10 | 00 |
| Refresh | NR | NR | NR | TR | NR | NR | NR | TR | NR | NR | NR | TR | NR | NR | NR | NR |
| CNT2 | 17 | 18 | 19 | 20 | 21 | 22 | 23 | 24 | 25 | 26 | 27 | 28 | 29 | 30 | 31 | 32 |
| CNT1 | 01 | 10 | 11 | 00 | 01 | 10 | 11 | 00 | 01 | 10 | 11 | 00 | 01 | 10 | 00 | 01 |
| Refresh | NR | NR | TR | NR | NR | NR | TR | NR | NR | NR | TR | NR | NR | NR | NR | NR |
| CNT2 | 33 | 34 | 35 | 36 | 37 | 38 | 39 | 40 | 41 | 42 | 43 | 44 | 45 | 46 | 47 | 48 |
| CNT1 | 10 | 11 | 00 | 01 | 10 | 11 | 00 | 01 | 10 | 11 | 00 | 01 | 10 | 00 | 01 | 10 |
| Refresh | NR | TR | NR | NR | NR | TR | NR | NR | NR | TR | NR | NR | NR | NR | NR | NR |
| CNT2 | 49 | 50 | 51 | 52 | 53 | 54 | 55 | 56 | 57 | 58 | 59 | 60 | 61 | 62 | 63 | 64 |
| CNT1 | 11 | 00 | 01 | 10 | 11 | 00 | 01 | 10 | 11 | 00 | 01 | 10 | 00 | 01 | 10 | 11 |
| Refresh | TR | NR | NR | NR | TR | NR | NR | NR | TR | NR | NR | NR | NR | NR | NR | TR |

Table 1 shows changing values of the first and second counting information CNT1 and CNT2, which respectively have cyclic periods 4 (N=4) and 64 (L=64), due to inputs of the refresh command REF, and shows the target refresh operation (TR) performed at every 4th input count (CNT1="11", binary representation of decimal 4) of the refresh command REF as well as the normal refresh operation (NR). Table 1 also shows the first counting information CNT1 initialized after every 15th (M=15) input of the refresh command REF regardless of the current value of the first counting information CNT1, thereby changing activation point of the target refresh operation performed at every 4th input count (CNT1="11") of the refresh command REF. As shown in Table 1, during the 1st to 16th input of the refresh command REF, the second refresh signal generator 520 may enable the second refresh signal REF2 in response to every 4th input of the refresh command REF in a cyclic period of 4, or each value "11" of the first counting information CNT1. When the refresh command REF is inputted 15 times corresponding to a multiple of 15, the second counter 620 may enable the initialization signal INIT. Thus, the first counting information CNT1 may be initialized from the value "10" to "00" after the refresh command REF is inputted 15 times.

During the 17th to 32nd inputs of the refresh command REF, the second refresh signal generator 520 may enable the second refresh signal REF2 in response to every 3rd input of the refresh command REF in the cyclic period of 4, or each value "11" of the first counting information CNT1. When the refresh command REF is inputted 30 times corresponding to double of 15, the second counter 620 may enable the initialization signal INIT. Thus, the first counting information CNT1 may be initialized from a value of "10" to "00" after the refresh command REF is inputted 30 times.

During the 33rd to 48th input of the refresh command REF, the second refresh signal generator 520 may enable the second refresh signal REF2 in response to every 2nd input of the refresh command REF in the cyclic period of 4, or each value "11" of the first counting information CNT1. When the refresh command REF is inputted 45 times corresponding to a triple of 15, the second counter 620 may enable the initialization signal INIT. Thus, the first counting information CNT1 may be initialized from the value to "00" after the refresh command REF is inputted 45 times.

During the 49th to 64th input of the refresh command REF, the second refresh signal generator 520 may enable the second refresh signal REF2 in response to every first input of the refresh command REF in the cyclic period of 4, or each value "11" of the first counting information CNT1. When the refresh command REF is inputted 60 times corresponding to a quadruple of 15, the second counter 620 may enable the initialization signal INIT. Thus, the first its counting information CNT1 may be initialized from a value of "10" to "00" after the refresh command REF is inputted 60 times.

The second counting information CNT2 may have a binary value and may be initialized to an initial value when the refresh command REF is inputted after the second counting information CNT2 is counted to a maximum value. The binary value 0000000 to 1111111 corresponds to 0 (initial value) to 63 (maximum value), respectively. The signal generator 630 may determine whether the refresh command REF was inputted by a multiple of 15 using the second counting information CNT2.

As described above, the second refresh signal generator 520 may continuously change the sequential order in which the refresh signal REF2 is enabled in a cycle where the refresh command REF is inputted N times, using two counters.

Figure 7:
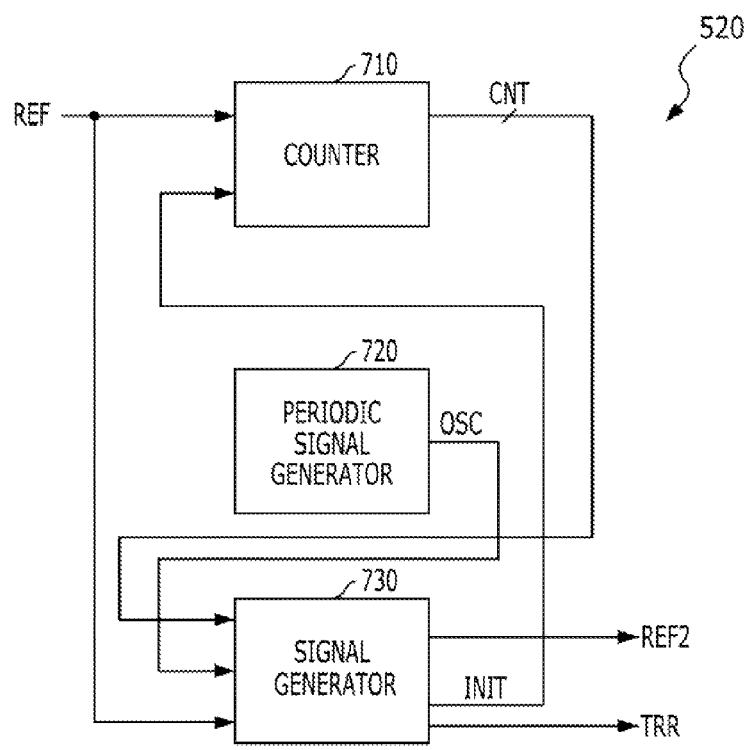
FIG. 7 is a block diagram illustrating an example of a second refresh signal generator shown in FIG. 5.

FIG. 7 is a block diagram illustrating an example of a second refresh signal generator 520 shown in FIG. 5.

As illustrated in FIG. 7, the second refresh signal generator 520 may include a counter 710, a periodic signal generator 720, and a signal generator 730. The counter 710 may count the refresh command REF and generate counting information CNT, which has the cyclic period N. The periodic signal generator 720 may generate a periodic signal OSC which toggles at a preset period, for example, the cyclic period M. The signal generator 730 may enable the second refresh signal REF2 and the target refresh signal TRR in response to the refresh command REF when the counting information CNT has a preset value. Furthermore, the signal generator 730 may enable the initialization signal INIT in response to the periodic signal OSC. The counter 710 may initialize the counting information CNT to an initial value at every N-th input of the refresh command REF or when the initialization signal INIT is enabled.

The second refresh signal generator 520 of FIG. 7 may enable the second refresh signal REF2 in response to the refresh command REF when the counting information CNT has a preset value, for example 4 or binary "11" (N=4), and may initialize the counting information CNT at a preset period, for example 15 (M=15), regardless of the counting information CNT. For example, the counter 710 may count the counting information CNT in the order of 00 (initial value), 01, 10, and 11 (maximum value), which are binary representations of decimal 1 to 4. When the counting information CNT is binary "11" representing decimal 4, the second refresh signal generator 520 may enable the second refresh signal REF2 in response to the refresh command REF, and periodically initialize the value of the counting information CNT. The counting information CNT may be initialized while counted in a similar manner to that described with reference to FIG. 6. The order in which the second refresh signal REF2 is enabled may then be changed in a cycle where the refresh command REF is inputted four times. That is, the control unit 470 may perform the target refresh operation at every N-th input count (CNT) of the refresh command REF, and may intermittently reset or initialize the input count (CNT) of the refresh command REF after every M-th input of the refresh command REF by the periodic signal OSC having the cyclic period M in order to change activation point of the target refresh operation.

Figure 8:
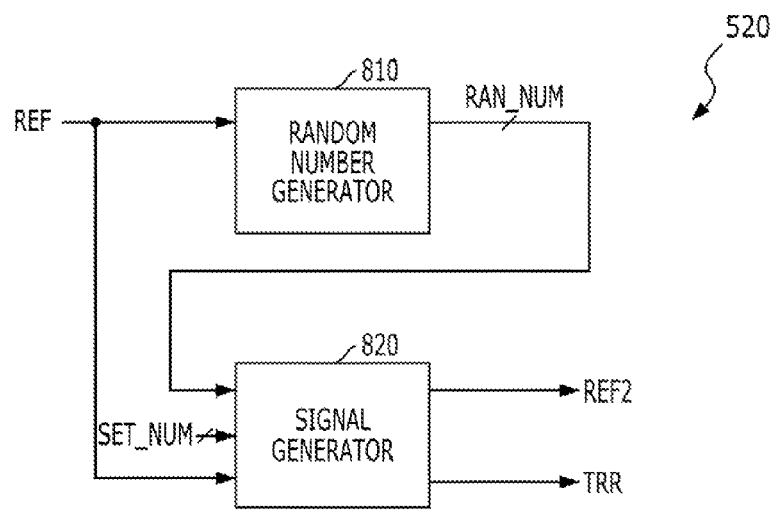
FIG. 8 is a block diagram illustrating an example of a second refresh signal generator shown in FIG. 5.

FIG. 8 is a block diagram illustrating an example of a second refresh signal generator 520 shown in FIG. 5.

As illustrated in FIG. 8, the second refresh signal generator 520 may include a random number generator 810 and a signal generator 820. The random number generator 810 may generate a random number RAN_NUM when the refresh command REF is enabled. The random number generator 810 may randomly generate a number from a group of integers stored therein. Generation of the random integers may also be random.

The signal generator 820 may enable the second refresh signal REF2 and the target refresh signal TRR when the random number RAN_NUM is equal to a preset number SET_NUM. Since the random number RAN_NUM generated by the random number generator 810 has a random value, the time at which the random number RAN_NUM is equal to the preset number SET_NUM may be random. Thus, the memory may perform the target refresh operation at a random time. The smaller the size of the group of numbers for generating the random number RAN_NUM, the higher the probability that the signal generator 820 enables the second refresh signal REF2. Furthermore, the greater the size of the group of numbers stored in the random number generator 810, the lower the probability that the signal generator 820 enables the second refresh signal REF2.

Figure 9:
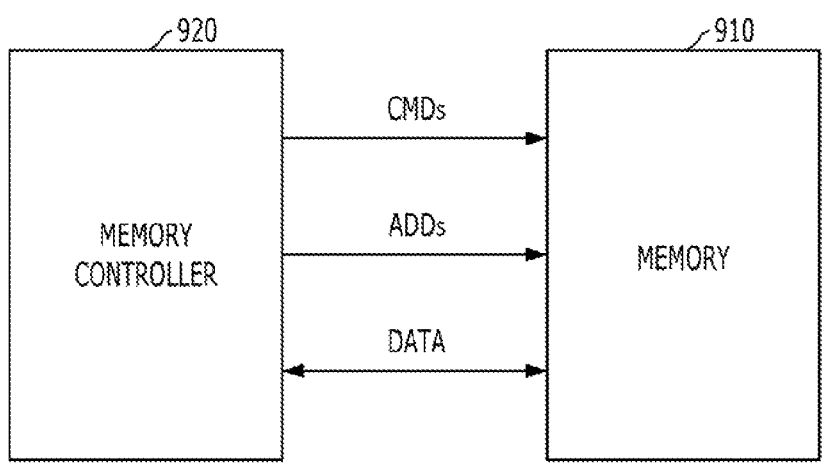
FIG. 9 is a configuration diagram of a memory system in accordance with an embodiment of the present invention.

FIG. 9 is a configuration diagram of a memory system in accordance with an embodiment of the present invention.

As illustrated in FIG. 9, the memory system may include a memory 910 and a memory controller 920.

The memory controller 920 may apply commands CMDs and addresses ADDs to the memory 910 to control the operation of the memory 910 and exchange data DATA with the memory 910 during a read or write operation. The memory controller 820 may transmit the command CMDs to input an active command ACT, a precharge command PRE, or a refresh command REF to the memory 910. The memory controller 920 may transmit addresses ADDs for selecting a cell block and a word line to activate in the memory 910 when inputting the active command ACT. The memory controller 920 may periodically transmit the refresh command REF to the memory 910.

The memory 910 may include the memory described with reference to FIG. 4. When the memory 910 is the memory of FIG. 4, the memory 910 may perform a target refresh operation in response to the refresh command REF at a random time.

The target address TAR_ADD used during the target refresh operation may include an address which the target address generation unit 460 generates using a highly active address HIGH_ADD detected through the address detection unit 450. For reference, the configuration and operation of the memory 910 used to perform the refresh operation may be the same as those described with reference to FIGS. 4 to 8.

The memory system may store the highly active address HIGH_ADD and perform a target refresh operation at a random time. Thus, the possibility of an error occurring may be reduced when the memory does not prevent word line disturbance even though the target refresh operation was performed.

In accordance with the embodiments of the present invention, the memory and the memory system may normally operate by performing an additional refresh operation on memory cells, of which data may be degraded by word line disturbance, at a random time.

Although various embodiments have been described for illustrative purposes, it will be apparent to those skilled in the art that various changes and modifications may be made without departing from the spirit and scope of the invention as defined in the following claims.

What is claimed is:

1. A memory comprising:
   a plurality of word lines coupled to one or more memory cells;
   an address counting unit suitable for generating counting addresses, values of which are changed whenever a word line is refreshed;
   a target address generation unit suitable for generating one or more target addresses using stored addresses; and
   a control unit suitable for sequentially refreshing word lines corresponding to the counting addresses and a target word line corresponding to a target address in response to refresh commands, which are periodically inputted, wherein the target word line is refreshed at a random order for a series of the refresh commands.

2. The memory of claim 1, further comprising an address detection unit suitable for detecting a highly active word line that is activated by a number greater than or equal to a preset number or that has an activation frequency greater than or equal to a preset frequency, during a preset period.

3. The memory of claim 2, wherein the target address generation unit stores an address of the highly active word line, and
   wherein the target word line corresponding to the target address is adjacent to the highly active word line.

4. The memory of claim 1, wherein the control unit refreshes the target word line corresponding to the target address while the refresh commands are inputted N times, and changes sequential order in which the target word line is refreshed during N times of inputs of the refresh commands.

5. The memory of claim 1, wherein the control unit comprises:
   a refresh control unit suitable for enabling a first refresh signal in response to the refresh commands, and enabling a second refresh signal in response to a refresh command at a random time; and
   a row control unit suitable for refreshing the word lines corresponding to the counting addresses in response to the first refresh signal, and refreshing the target word line corresponding to the target address in response to the second refresh signal.

6. The memory of claim 5, wherein the refresh control unit comprises:

a first refresh signal generator suitable for enabling the first refresh signal in response to the refresh commands; and a second refresh signal generator suitable for enabling the second refresh signal in response to the refresh command at a random time.

7. The memory of claim 6, wherein the second refresh signal generator comprises:

a first counter suitable for counting the refresh command to generate first counting information;

a second counter suitable for counting the refresh command generate second counting information; and a signal generator suitable for enabling the second refresh signal in response to the refresh command when the first counting information has a preset value, and controlling the first counter to initialize the first counting information to an initial value when the second counting information has a preset value.

8. The memory of claim 6, wherein the second refresh signal generator comprises:

a counter suitable for counting the refresh command to generate counting information;

a periodic signal generator suitable for generating a periodic signal which toggles at a preset period; and a signal generator suitable for enabling the second refresh signal in response to the refresh command when the counting information has a preset value, and controlling the counter to initialize the counting information to an initial value in response to the periodic signal.

9. The memory of claim 6, wherein the second refresh signal generator comprises:

a random number generator suitable for generating a random number in response to the refresh command; and a signal generator suitable for enabling the second refresh signal when the random number has a preset value.

10. The memory of claim 5, wherein the target address generation unit outputs the target address when the second refresh signal is enabled.

11. A memory system comprising:

a memory; and a memory controller suitable for periodically inputting refresh commands to the memory, wherein the memory comprises:

a plurality of word lines coupled to one or more memory cells;

an address counting unit suitable for generating counting addresses, values of which are changed whenever a word line is refreshed;

a target address generation unit suitable for generating one or more target addresses using stored addresses; and a control unit suitable for sequentially refreshing word lines corresponding to the counting addresses and a target word line corresponding to a target address in response to the refresh commands, which are periodically inputted, wherein the target word line is refreshed at a random order for a series of the refresh commands.

12. The memory system of claim 11, wherein the memory detects a highly active word line that is activated by a number of times greater than or equal to a preset number or that has an activation frequency greater than or equal to a preset frequency, during a preset period.

13. The memory system of claim 12, wherein the target address generation unit stores an address of the highly active word line, and wherein the target word line corresponding to the target address is adjacent to the highly active word line.

14. The memory system of claim 11, wherein the memory controller inputs an active command and an address to the memory between periodical inputs of the refresh commands.

15. The memory system of claim 11, wherein the control unit refreshes the target word line corresponding to the target address while the refresh commands are inputted N times, and changes sequential order in which the target word line is refreshed during N times of inputs of the refresh commands.

16. The memory system of claim 15, wherein the memory generates counting information, a value of which is changed whenever a word line is refreshed, refreshes the target word line in response to the refresh command when the counting information has a preset value, and initializes the counting information to an initial value at a preset time.

* * * * *